United States Patent
Lin et al.

(10) Patent No.: US 8,111,547 B2
(45) Date of Patent: Feb. 7, 2012

(54) MULTI-BIT FLASH MEMORY AND READING METHOD THEREOF

(75) Inventors: Yung-Feng Lin, Taoyuan County (TW); Nian-Kai Zous, Taoyuan County (TW); I-Jen Huang, Kaohsiung (TW); Yin-Jen Chen, Taipei County (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 12/636,095

(22) Filed: Dec. 11, 2009

(65) Prior Publication Data

US 2010/0085809 A1 Apr. 8, 2010

Related U.S. Application Data

(63) Continuation of application No. 11/826,574, filed on Jul. 17, 2007, now Pat. No. 7,643,337.

(51) Int. Cl.
*G11C 11/34* (2006.01)
(52) U.S. Cl. .................. 365/184; 365/185.09
(58) Field of Classification Search ............. 365/185.09, 365/184
See application file for complete search history.

(56) References Cited

U.S. PATENT DOCUMENTS

| | | | |
|---|---|---|---|
| 6,490,198 B2 * | 12/2002 | Yoshimura | 365/185.09 |
| 6,665,212 B1 * | 12/2003 | Fan et al. | 365/185.2 |
| 6,822,907 B2 | 11/2004 | Maruyama et al. | |
| 7,164,604 B2 * | 1/2007 | Arakawa | 365/185.21 |
| 7,286,431 B2 | 10/2007 | Hidaka | |
| 7,369,433 B2 | 5/2008 | Toda | |
| 2003/0043621 A1 * | 3/2003 | Wong | 365/185.03 |
| 2003/0112664 A1 | 6/2003 | Yamano | |
| 2003/0169622 A1 * | 9/2003 | Ooishi et al. | 365/185.21 |
| 2006/0002216 A1 * | 1/2006 | Ooishi | 365/210 |
| 2006/0274581 A1 * | 12/2006 | Redaelli et al. | 365/185.22 |
| 2007/0133275 A1 * | 6/2007 | Chang et al. | 365/185.2 |
| 2009/0109763 A1 * | 4/2009 | Koshita | 365/189.07 |

* cited by examiner

*Primary Examiner* — Michael Tran
(74) *Attorney, Agent, or Firm* — Rabin & Berdo, P.C.

(57) ABSTRACT

A multi-bit flash memory and a reading method thereof. Multiple reference memory cells for saving reserved data are provided to operate together with multiple data memory cells. Before the data memory cells are read, data stored in the reference memory cell is sensed based on a present reference current. Then, a value of a new reference current for reading the data memory cells is determined according to a difference between the sensed data and the reserved data.

8 Claims, 5 Drawing Sheets

MULTI-BIT FLASH MEMORY AND READING METHOD THEREOF

CROSS-REFERENCE TO RELATED APPLICATION

This application is a continuation of U.S. patent application Ser. No. 11/826,574, filed Jul. 17, 2007, now U.S. Pat. No. 7,643,337 B2, which is incorporated by reference.

BACKGROUND OF THE INVENTION

1. Field of the Invention

The invention relates in general to a flash memory, and more particularly to a multi-bit flash memory and a reading method thereof.

2. Description of the Related Art

A charge trapping memory utilizes a localized charge trapping layer to replace a "polysilicon floating gate" in capturing electrons or holes. This localized charge trapping layer is made of a silicon nitride material. The silicon-nitride charge trapping layer is not a conductor. So, compared the flash memory with the typical polysilicon floating gate, the electrons or holes injected into the silicon-nitride charge trapping layer theoretically cannot diffuse over the silicon-nitride charge trapping layer evenly but are concentrated on a local area, such as left and right sides in the flash memory cell. Thus, according to this property, one memory cell can store at least 2 bit of logic data.

However, some electrons or holes are not offset and remain on the silicon-nitride charge trapping layer after the memory has been programmed and erased for many times, thereby causing the variation of the threshold voltage Vt. Consequently, the data read error may occur at the next reading process.

In view of this, the data read error occurring after many times of programming and erasing processes is a problem to be solved in the associated industry.

SUMMARY OF THE INVENTION

The invention is directed to a multi-bit flash memory and a reading method thereof capable of improving the correctness of data reading.

According to a first aspect of the present invention, a multi-bit flash memory is provided. The multi-bit flash memory includes data memory cells, reference memory cells and one sensing component. The data memory cells are changed data together. The reference memory cells are used for saving reserved data. The reference memory cells are also changed data together with the data memory cells. The sensing component is connected to these data memory cells and these reference memory cells. Before the data memory cells are read, the sensing component senses the data stored in the reference memory cells based on a present reference current, and then determines a value of the reference current for reading the data memory cells according to a difference between the sensed data and the reserved data.

According to a second aspect of the present invention, a method of reading a multi-bit flash memory is provided. The multi-bit flash memory has multiple data memory cells changed data together. The method includes the following steps. Data stored in multiple reference memory cells are sensed based on a present reference current. The reference memory cells are used for saving reserved data and are changed data together with the data memory cells. A difference between the data sensed from the reference memory cells and the reserved data is determined by way of comparison. If the difference between the data sensed from the reference memory cells and the reserved data does exist, a value of the reference current is adjusted according to the difference until the data, which is stored in the reference memory cells sensed based on the adjusted reference current, matches with the reserved data. The data memory cells are read based on the adjusted reference current.

The invention will become apparent from the following detailed description of the preferred but non-limiting embodiments. The following description is made with reference to the accompanying drawings.

DETAILED DESCRIPTION OF THE INVENTION

Figure 1:
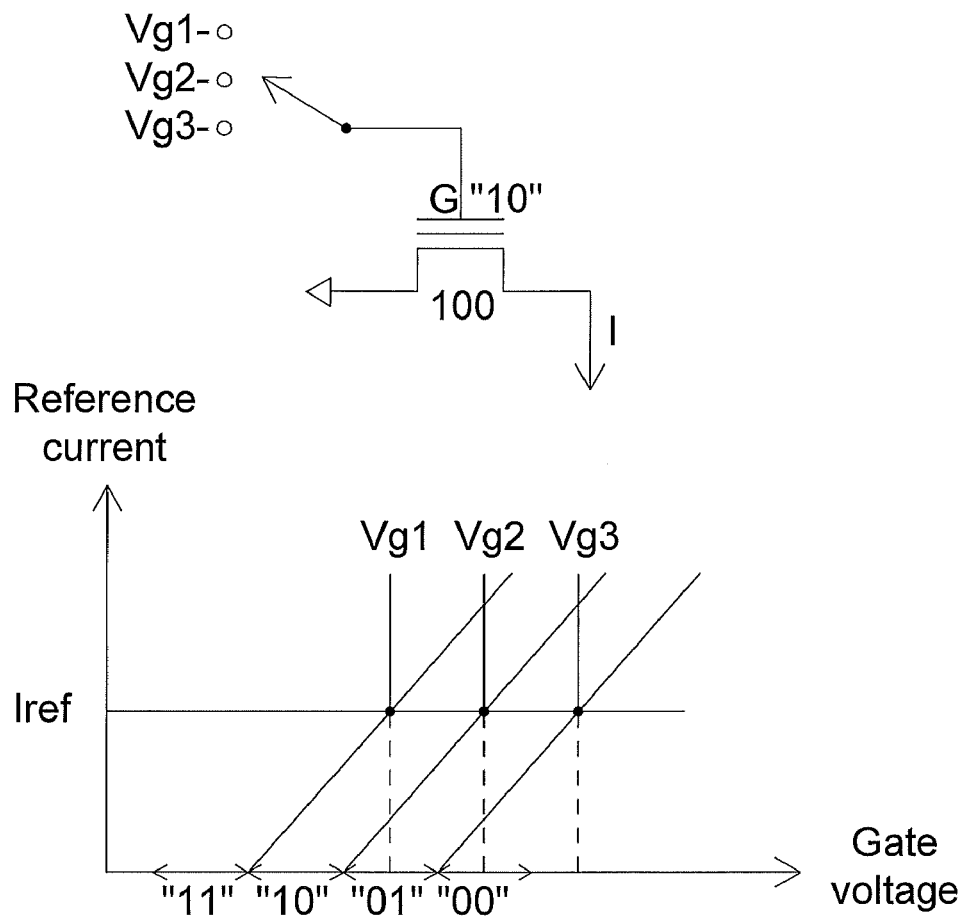
FIG. 1 is a schematic illustration showing the constant current architecture.

A multi-bit flash memory utilizes a "constant current" architecture to read data stored in data memory cells. FIG. 1 is a schematic illustration showing the constant current architecture. The illustration will be made by taking one multi-bit memory cell 100, in which each side can store two bits, as an example. Because of the 2-bit data, the constant current architecture provides three gate voltages Vg1, Vg2 and Vg3 to a gate G of the memory cell 100 to distinguish four logic states (00, 01, 10 and 11). When the three gate voltages Vg1, Vg2 and Vg3 are being applied, it is determined that the current, which flows out of the multi-bit memory cell 100 under which gate voltages, is closest to a reference current and, for example, greater than the reference current by a predetermined value. Thus, the logic state to which the data state thereof pertains may be judged. For example, the ON current of the multi-bit memory cell 100 when the gate voltages Vg3 and Vg2 are applied to the multi-bit memory cell is greater than a reference current Iref by a predetermined value and Vg1 is applied to the multi-bit memory cell is less than a reference Iref by a predetermined value, the data stored in the multi-bit memory cell pertains to a secondary lowest logic state corresponding to the threshold voltage, such as the logic state "10" of FIG. 1.

The concept of this embodiment is to provide multiple reference memory cells for saving reserved data and multiple data memory cells, which operate (program and erase) together, and the data stored in the reference memory cells are sensed based on a present reference current, such as a default reference current, before reading. Then, a value of a new reference current for reading the data memory cells is determined according to a difference between the sensed data and the reserved data.

Figure 2:
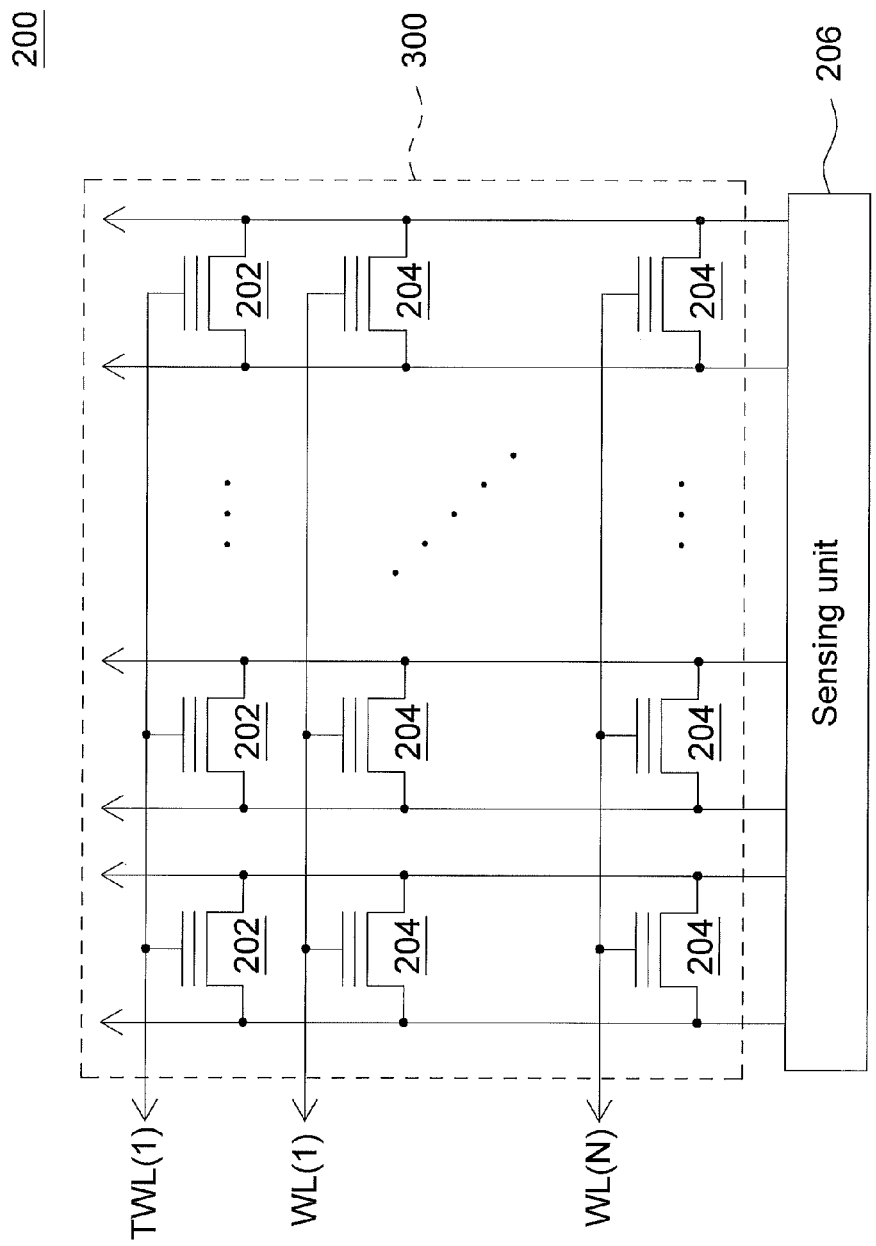
FIG. 2 is a schematic illustration showing the architecture of a multi-bit flash memory according to a preferred embodiment of the invention.

FIG. 2 is a schematic illustration showing the architecture of a multi-bit flash memory 200 according to a preferred embodiment of the invention. Referring to FIG. 2, the multi-bit flash memory 200 has multiple reference memory cells 202, multiple data memory cells 204 and one sensing component 206. The reference memory cells 202 are changed (program and erase) data together with the data memory cells 204. As shown in FIG. 2, for example, the data memory cells 204 are all in a sector 300, and the reference memory cells 202 are disposed in the sector 300 so as to operate together with the data memory cells 204 when the data is being updated. The sensing component 206 is connected the data memory cells 204 and the reference memory cells 202. Before the data memory cells 204 are read, the sensing component 206 senses the data stored in the reference memory cells 202 based on a present reference current (not shown). Then, the sensing component 206 determines a value of a new reference current for reading the data memory cells 204 according to a difference between the sensed data and the reserved data. The present reference current may be, for example, the default reference current or the reference current for reading the sector 300 last.

As shown in FIG. 2, the data memory cells 204 are electrically connected to corresponding word lines WL(1) to WL(N) respectively, wherein N is a positive integer; and the reference memory cells 202 are electrically connected to another corresponding word line TWL(1) respectively. That is, the word line TWL(1) connected to the reference memory cells 202 is additionally disposed in the sector 300 of this embodiment. Because the reference memory cells 202 and the data memory cells 204 are disposed in the same sector 300, the same number of program and erase operations are performed in the reference memory cells 202 and the data memory cells 204. That is, the threshold voltage variation of the reference memory cell 202 is similar to that of the data memory cell 204. The invention is not restricted to the particular architecture, in which the reference memory cell 202 is disposed in each sector. For example, the reference memory cells and the data memory cells may share the word lines in the same sector, or the reference memory cells and the data memory cells may operate together according to other methods. In addition, the number of the reference memory cells 202 also has to be high enough to represent the condition of the threshold voltage variation after multiple times of program and erase operations in the data memory cells 204.

The reference memory cells 202 always save the reserved data. For example, when the reference memory cells 202 are operated together with the sector 300, the reserved data is always written into the reference memory cells 202. Because the reference memory cells 202 save the known data, the sensing component 206 senses the reference memory cells 202 based on the present reference current Iref, and then compares the sensed data with the reserved data to obtain the difference between the reserved data and the sensed data, which is sensed by the reference memory cells 202 based on the present reference current Iref. The difference stands for the variation relationship between the present reference current Iref and the threshold voltage corresponding to each logic state of the present reference memory cell 202. In addition, because the threshold voltage variation of the reference memory cell 202 is similar to that of the data memory cell 204, this difference may also be regarded (considered) as the variation relationship between the present reference current Iref and the threshold voltage corresponding to each logic state of the present data memory cell 204. Thus, the sensing component 206 adjusts the value of the reference current Iref according to the difference until the data stored in the reference memory cells sensed based on the reference current Iref matches with the reserved data. When the data memory cells 204 are being read, the sensing component 206 provides the adjusted reference current Iref as the reference for reading the data memory cells 204. Thus, it is possible to prevent the problem of data read error after multiple times of programming and erasing cycles. Wherein after comparison, if the data sensed by the reference memory cells 202 matches with the reserved data, the sensing component 206 directly provides the present reference current Iref as the reference for reading the data memory cells 204.

The memory cell array depicted in FIG. 2 has the NOR type architecture. However, one of ordinary skill in the art may also achieve the effect of the invention using any other architecture of the memory cell array according to the concept of this embodiment. This embodiment is not restricted to the type of the architecture of the memory cell array for implementing the invention.

Figure 3:
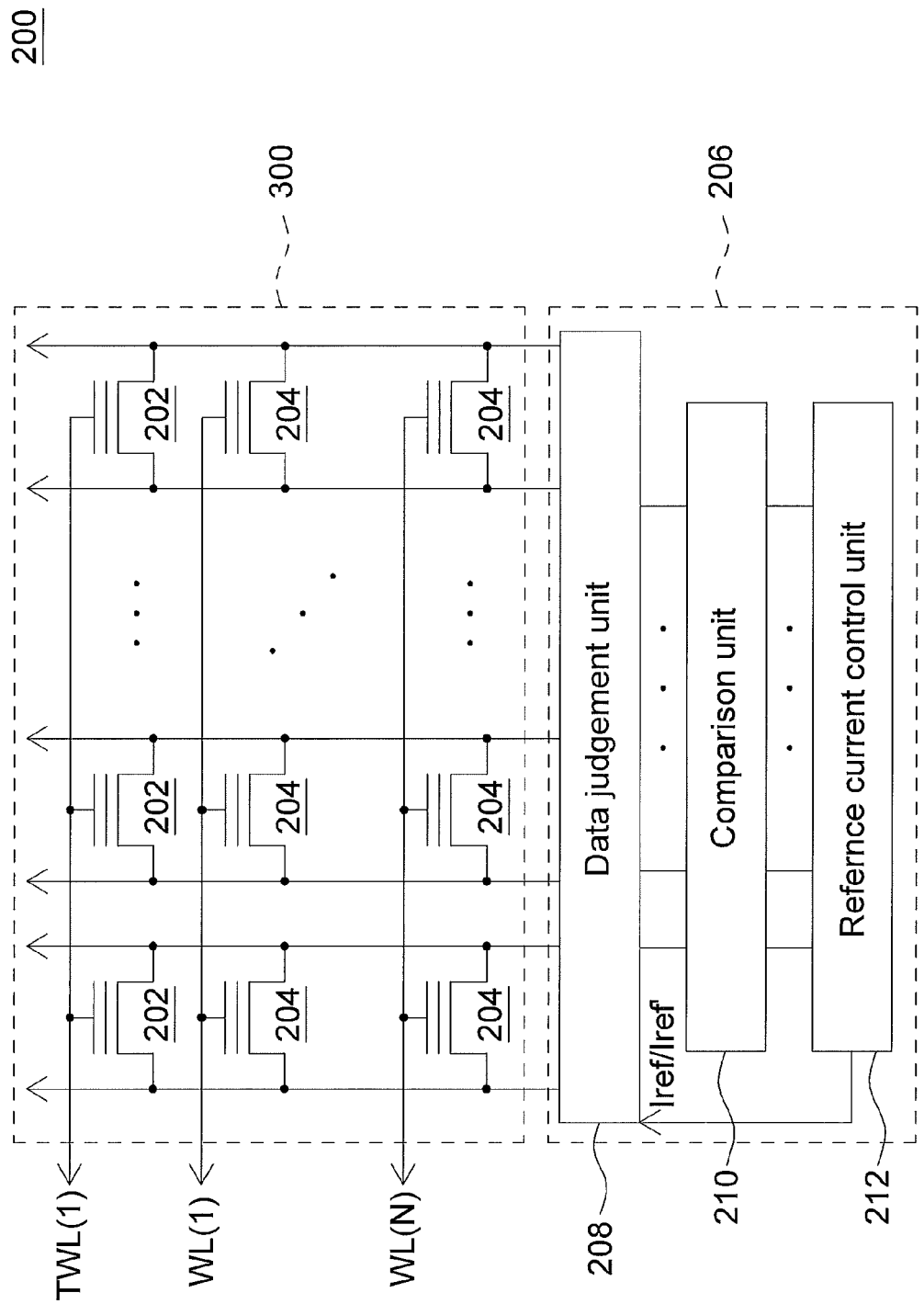
FIG. 3 is a schematic illustration showing the architecture of sensing components according to the invention.

FIG. 3 is a schematic illustration showing the architecture of sensing components according to the invention. Referring to FIG. 3, the sensing component 206 further includes a data judgement unit 208, a comparison unit 210 and a reference current control unit 212. The data judgement unit 208 is electrically connected to the reference memory cells 202 and the data memory cells 204, judges which logic state (e.g., "00" or "01" or "11" or "10") the data stored in the reference memory cells 202 or the data memory cells 204 pertains to according to reference current Iref, and thus outputs the data stored in the reference memory cells 202 to the comparison unit 210. The comparison unit 210 compares the data sensed from the reference memory cells 202 with the reserved data to determine whether they match with each other, and thus outputs a comparison result to the reference current control unit 212. When the comparison result represents that the logic state corresponding to the data sensed by the reference memory cells 202 becomes the logic state corresponding to the higher threshold voltage level, the reference current control unit 212 reduces the value of the present reference current. On the contrary, when the comparison result represents that the logic state corresponding to the data sensed by the reference memory cells 202 becomes the logic state corresponding to the lower threshold voltage level, the reference current control unit 212 increases the value of the present reference current. The reference current control unit 212 provides the adjusted reference current, such as Iref', to the data judgement unit 208. The data judgement unit 208 again senses the data stored in the reference memory cells 202 according to the new reference current Iref'. The comparison unit 210 again compares the data sensed from the reference memory cells 202 with the reserved data to determine whether they match with each other so as to ensure the correctness of reading the data according to the new reference current Iref'.

The reference current control unit 212 gradually adjusts the value of the reference current in a stepping manner. In addition, the reference current control unit 212 finds the reference current, which enables the data sensed from all the reference memory cell 202 to match with the reserved data, according to the variations of various logic states in correspondence with the variations of different logic states (e.g., the threshold voltages of some memory cells rise while the threshold voltages of the other memory cells drop). That is, the types of the reserved data include various logic states to ensure that the threshold voltage variation of the reference memory cell is similar to that of the data memory cells. For example, as for one memory cell capable of storing 2 bits of data, the reserved data includes all various logic states "00", "01", "10" and "11". In this invention, the type and arrangement of the reserved data are not particularly limited, wherein the arrangement of the reserved data represents that the data is stored in which reference memory cells. One of ordinary skill in the art may easily design any modification according to the above-mentioned concept. Preferably, the reserved data can set the data type according to the data storing property (e.g., the second bit effect) and the contained logic states.

Figure 4A:
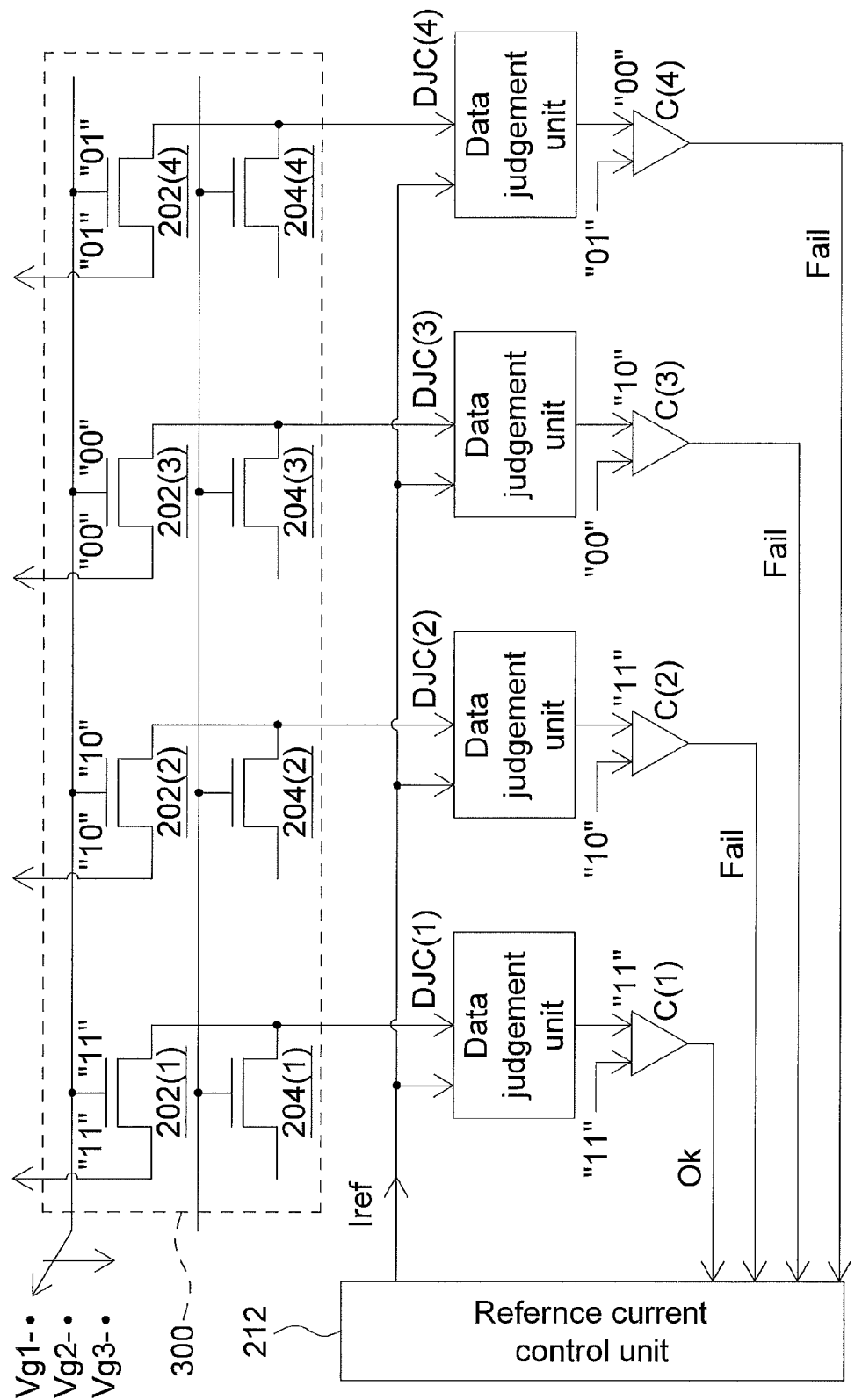
FIG. 4A is a schematic illustration showing the architecture of sensing components according to the invention.

FIG. 4A is a schematic illustration showing the architecture of sensing components according to the invention. For explaining clearly and conveniently, in FIG. 4A four reference memory cells 202(1) to 202(4) and four data memory cells 204(1) to 204(4) are depicted as an example, and one memory cell can store 2-bit of data. The reference memory cells 202(1) to 202(4) respectively save reserved data "11", "10", "00" and "01". The data judgement unit 208 further has, for example, four data judging circuits DJC(1) to DJC(4) corresponding to the number of the reference memory cells 202. The data judging circuits DJC(1) to DJC(4) respectively sense the corresponding memory cells 202 and receive the reference current Iref. The comparison unit 210 further has, for example, four comparators C(1) to C(4) corresponding to the number of the reference memory cells 202. The comparators C(1) to C(4) are respectively connected with the corresponding data judging circuits DJC to receive the data of the corresponding reference memory cells and the reserved data. For example, one end of the first comparator C(1) is connected with the first data judging circuit DJC(1) to receive the data of the first reference memory cell 202(1), and the other end of the first comparator C(1) receives the reserved data "11".

Figure 4B:
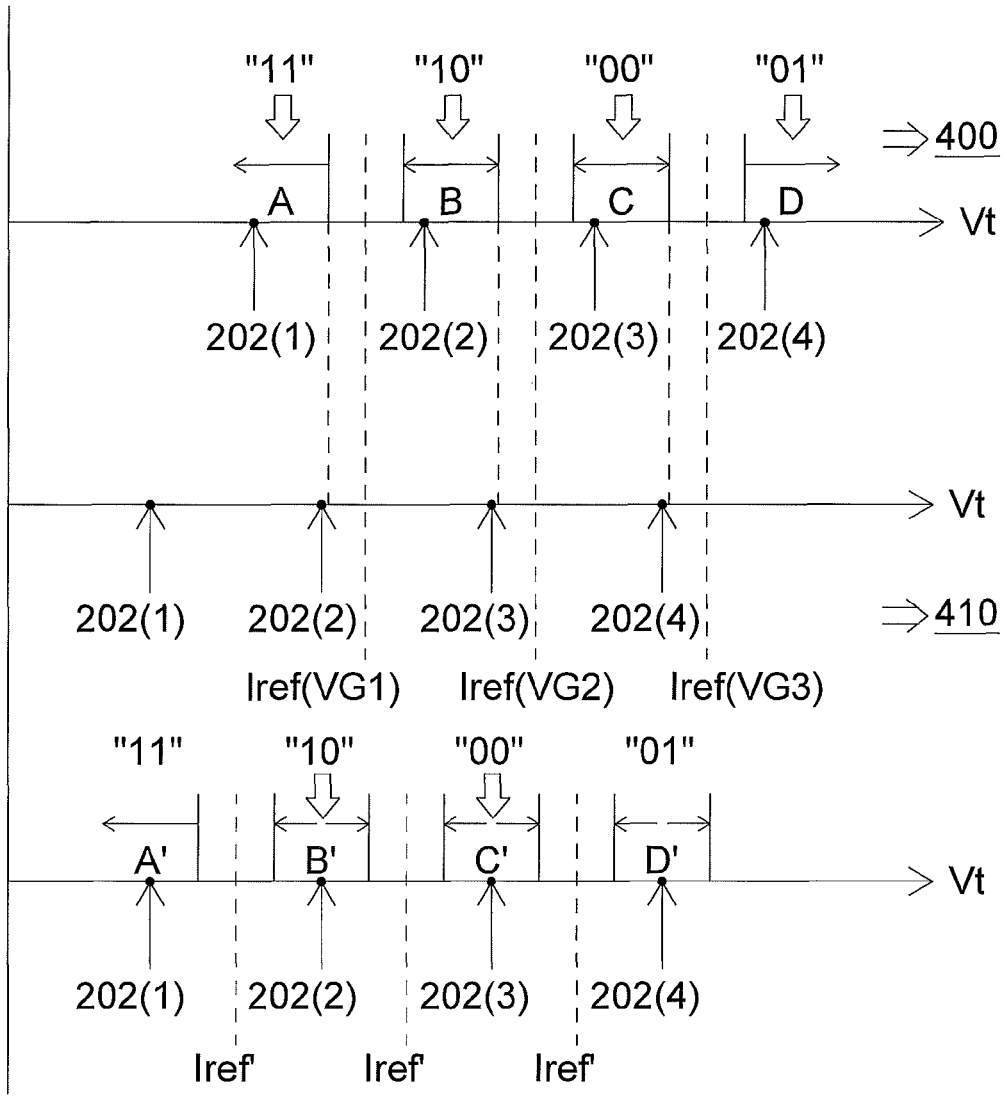
FIG. 4B is a schematic illustration showing threshold voltages corresponding to the reference currents and the logic states.

FIG. 4B is a schematic illustration showing threshold voltages corresponding to the reference currents and the logic states. Four logic states correspond to the values of the threshold voltages are sequentially "11", "10", "00" and "01" from low to high. The relationship between the default operation window (i.e., the threshold voltage corresponding to each logic state) and the reference current is represented by symbol 400.

For example, after the sector 300 has been programmed and erased many times, the threshold voltage of the reference memory cell 202 is shifted. For instance, the threshold voltage of the reference memory cell 202(2) for storing the logic data "10" falls from the distribution B to the distribution A (the threshold voltage range corresponding to the logic data "11"). The threshold voltage variations of other reference memory cells 202(1), 202(3) and 202(4) are shown in the drawing. That is, the data read error may occur if the conventional reading method is utilized in the condition of symbol 410 (i.e., the data memory cells are read based on the default reference current). For instance, the data "10" stored in the memory cell 202(2) is read as "11". However, before the data memory cells 204 are read in this embodiment, the reference current control unit 212 firstly provides one present reference current Iref, such as a default current value, to the data judging circuits DJC(1) to DJC(4), and multiple gate voltages VG1 to VG3 for distinguishing multiple logic states are applied to the reference memory cells 202 or at least one gate voltage for distinguishing multiple logic states is applied to the reference memory cells 202. Thus, the data judging circuits DJC(1) to DJC(4) respectively distinguish the data stored by the corresponding reference memory cells 202 based on the present reference current Iref. Next, the comparators C(1) to C(3) respectively compare the data of the reference memory cells 202 with the reserved data to obtain that the logic states "10", "00" and "01" are wrong. As shown in FIG. 4B, the logic states of the reference memory cells 202(2), 202(3) and 202(4) have become the logic states corresponding to the lower threshold voltage level, so the reference current control unit increases the reference current Iref. Then, all reference memory cells 202 are again sensed based on the adjusted reference current Iref' in order to ensure the correctness of the adjusted reference current Iref'. Finally, the data memory cells 204 are read based on the passed reference current.

In addition, when the varying property of the threshold voltage of the memory cell, such as the N-type memory cell, is observed for a long time, the threshold voltages corresponding to the four logic states thereof fall down (i.e., leftward movement on the drawing). So, it is also possible to apply one gate voltage for distinguishing multiple logic states to the reference memory cells. For instance, the gate voltage VG2 is applied to divide the four logic states 11, 10, 00 and 01 into two groups including a first group composed of 11, 10 and a second group composed of 00, 01. Thus, when the logic state is changed from the group of 11, 10 to the group of 00, 01, the reference current is decreased, or otherwise the reference current is increased. Of course, many methods may be utilized to find the relationship between the logic data stored in the reference memory cells and the predetermined logic data according to the different types of data judging circuits or different logic concepts. The invention is not particularly restricted to the corresponding relationship, according to which the value of the reference current for reading the data memory cells is determined. For example, the value of the reference current for reading the data memory cells may be determined by comparing the numbers of "0" and "1" between the "read logic data" and the "reserved data" to obtain the difference there between, or the middle value may be found directly.

The multi-bit flash memory and the reading method thereof of the invention can effectively solve the problem of the data read error caused by multiple times of writing and erasing cycles.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A multi-bit memory array, comprising:
a plurality of data memory cells;
a plurality of reference memory cells for storing reserved data, wherein the reference memory cells are programmed or erased together with each write of the memory data cells; and
a sensing circuit for sensing data stored in the reference memory cells based on a reference current before reading data stored in the data memory cells.

2. The multi-bit flash memory array according to claim 1, wherein the sensing circuit compares the data sensed from the reference memory cells with the reserved data stored in the reference memory cells to output the reference current.

3. The multi-bit flash memory array according to claim 1, wherein the data memory cells and the reference memory cells are disposed in a same sector of the multi-bit flash memory array.

4. The multi-bit flash memory array according to claim 1, wherein the data memory cells are respectively connected to corresponding word lines, and the reference memory cells are respectively connected to another corresponding word line.

5. The multi-bit flash memory array as claim 2, wherein the reserved data has different levels stored in the reference memory cells respectively.

6. A multi-bit memory array, comprising:

a plurality of data memory cells; and a plurality of reference memory cells for storing reserved data, wherein the reference memory cells are programmed or erased together with each write of the data memory cells;

wherein the data memory cells are respectively connected to corresponding word lines, and the reference memory cells are respectively connected to another corresponding word line.

7. The multi-bit flash memory array according to claim 6, wherein the data memory cells and the reference memory cells are disposed in a same sector of the multi-bit flash memory array.

8. The multi-bit flash memory array as claim 6, wherein the reserved data has different levels stored in the reference memory cells respectively.

* * * * *